(12) United States Patent
Boguslavskij et al.

(10) Patent No.: US 8,358,795 B2
(45) Date of Patent: Jan. 22, 2013

(54) RECEIVER SYSTEM AND METHOD FOR TRANSMITTING INFORMATION FOR AN OTOLOGICAL DEVICE

(75) Inventors: Mihail Boguslavskij, Coburg (DE); Gottfried Rückerl, Nürnberg (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 1354 days.

(21) Appl. No.: 11/879,948

(22) Filed: Jul. 19, 2007

(65) Prior Publication Data

US 2008/0025522 A1    Jan. 31, 2008

Related U.S. Application Data

(60) Provisional application No. 60/834,287, filed on Jul. 28, 2006.

(51) Int. Cl.
*H04R 25/00* (2006.01)
(52) U.S. Cl. .................. 381/316; 381/312; 381/315
(58) Field of Classification Search ............. 381/2, 23.1, 381/312–321; 329/323–325; 333/17.1; 334/78, 334/79; 331/1 R
See application file for complete search history.

(56) References Cited

U.S. PATENT DOCUMENTS

| | | | |
|---|---|---|---|
| 4,232,398 A | 11/1980 | Gould et al. | |
| 5,563,928 A * | 10/1996 | Rostoker et al. | 377/20 |
| 5,973,519 A * | 10/1999 | Yamashita | 327/101 |
| 6,029,055 A * | 2/2000 | Nobusawa | 455/259 |
| 6,307,427 B1 | 10/2001 | Yamazaki et al. | |
| 8,000,668 B2 | 8/2011 | Boguslavskij et al. | |
| 2004/0131213 A1 | 7/2004 | Niederdrank | |
| 2004/0175009 A1 | 9/2004 | Niederdrank et al. | |
| 2005/0036638 A1 | 2/2005 | Reithinger | |

FOREIGN PATENT DOCUMENTS

| | | |
|---|---|---|
| DE | 2744213 B1 | 1/1979 |
| DE | 28 54 852 C2 | 7/1980 |
| DE | 43 32 798 A1 | 3/1995 |
| DE | 102 45 555 A1 | 4/2004 |
| DE | 10305833 B3 | 8/2004 |
| DE | 10323219 B3 | 12/2004 |
| EP | 0829960 A2 | 3/1998 |
| EP | 1480492 A2 | 11/2004 |
| JP | 10013191 A | 1/1998 |

\* cited by examiner

*Primary Examiner* — Kenneth Parker
*Assistant Examiner* — John Lin

(57) ABSTRACT

The invention relates to a receiver system for an otological device. The receiver system has an oscillation receiver to receive a carrier signal with a carrier frequency. The receiver system is designed to change a receive frequency for the carrier signal. The receiver system has a frequency regulator which is designed to at least indirectly register the receive frequency and to change the receive frequency for the carrier signal to a predetermined receive frequency and to set it to the predetermined receive frequency. The frequency regulator is connected to the oscillation receiver at least at least indirectly and is designed to generate an excitation signal and to excite the oscillation receiver to oscillate by means of the excitation signal and thus to generate a response oscillation with a response frequency. The frequency regulator is also designed to ascertain the receive frequency depending on the response oscillation.

18 Claims, 1 Drawing Sheet

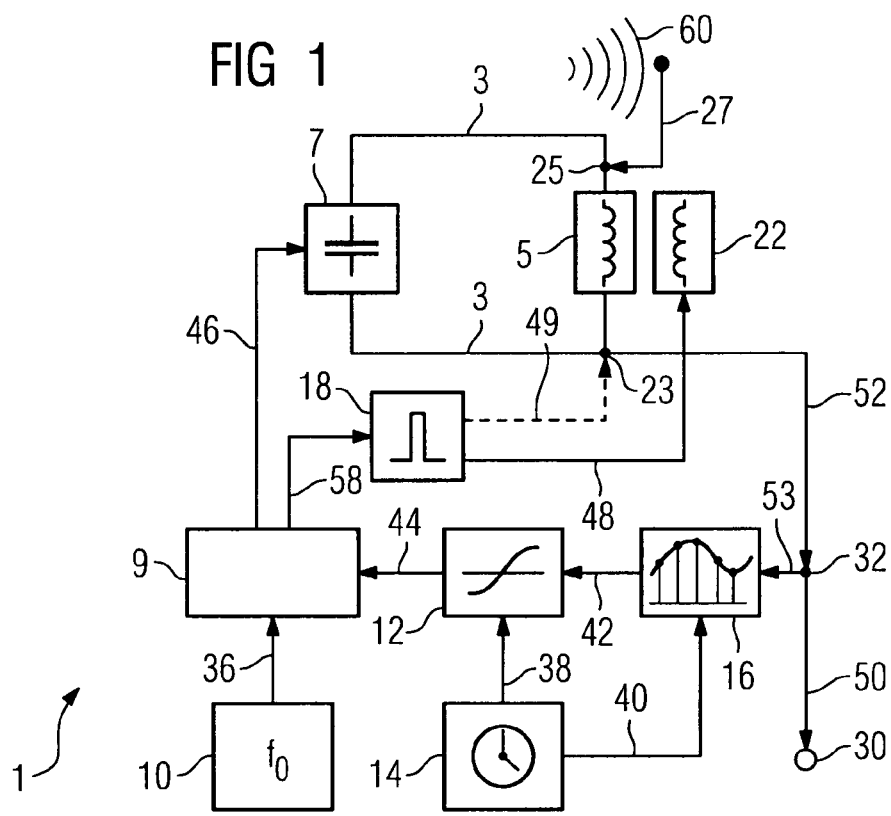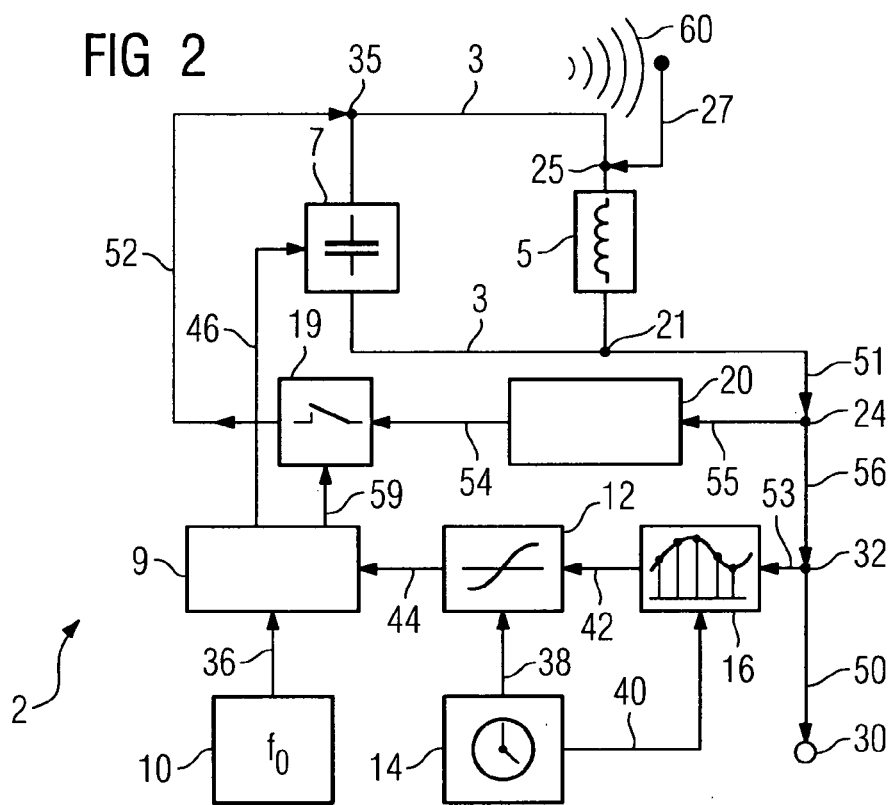

RECEIVER SYSTEM AND METHOD FOR TRANSMITTING INFORMATION FOR AN OTOLOGICAL DEVICE

CROSS REFERENCE TO RELATED APPLICATIONS

The present application claims the benefit of the provisional patent application filed on Jul. 28, 2006, and assigned application No. 60/834,287 which is incorporated by reference herein in its entirety.

FIELD OF THE INVENTION

The invention relates to a receiver system for an otological device for transmitting information.

BACKGROUND OF THE INVENTION

With regard to receiver systems for transmitting information to an otological device, particularly a hearing aid, for example by means of an accessory part, particularly a remote control, a programming unit or a comparable device, or from the otological device to another otological device or an accessory part, for example a remote control or a programming unit, correct tuning of a resonant frequency for an oscillation receiver of the receiver system is required since incorrect tuning of the resonant frequency has a major influence on a transmission quality or on an achievable transmission range. Normally, a frequency response of a receiver system has a bandpass characteristic with a center frequency, whereby the center frequency should be set as precisely as possible at a receive frequency provided for transmission purposes. A receive frequency for such a receiver is essentially determined by frequency determining components such as coils, capacitors or components connected thereto. Such components can exhibit tolerances of a predefined component value, which means that an initial tuning is necessary in order to specify a receive frequency. Furthermore, temperature- and ageing-related changes in the frequency determining components can render necessary a retuning.

With regard to radio receivers known from the prior art, a receive frequency can be tuned manually by a user. In addition, quartz-stabilized PLL receivers for example are known which require no retuning of a receive frequency (PLL=phase locked loop).

A quadrature modulation receiver is known from JP10013191A2 which is designed to change, and thus to retune, a receive frequency of the receiver circuit depending on a signal strength of a receiver circuit.

A PLL receiver, described above, can for example only be used with difficulty, or not at all, in otological devices, particularly hearing aids or in an accessory for hearing aids on account of a space requirement or a power consumption.

SUMMARY OF THE INVENTION

The invention is thus based on the problem of tuning or retuning a receive frequency of a receiver by using the simplest possible means.

This problem is solved by a receiver system for an otological device, which is provided for transmitting information.

The receiver system can for example form part of a sender/receiver system, particularly a transceiver.

The receiver system has an oscillation receiver, whereby the oscillation receiver is designed to receive a carrier signal with a carrier frequency. The receiver system is designed to change a receive frequency for the carrier signal. The receiver system has a frequency regulator which is designed to at least indirectly register the receive frequency and to change the receive frequency for the carrier signal to a predefined receive frequency and to set it to the predefined receive frequency.

The frequency regulator is connected to the oscillation receiver at least indirectly and is designed to generate an excitation signal and to excite the oscillation receiver to oscillate by means of the excitation signal and thus to generate a response oscillation with a response frequency. The frequency regulator is also designed to ascertain the receive frequency depending on the response oscillation.

In this manner, it is advantageously possible to register a natural frequency of a receiver system, for example of an oscillating circuit of a receiver system.

In a preferred embodiment, the excitation signal is a feedback signal generated in the oscillation receiver. In this embodiment, the frequency regulator is designed to feed back the oscillation receiver at least indirectly.

By means of such a feedback process, a receiving circuit of a receiver is excited to generate a natural oscillation with a natural frequency. The frequency regulator can advantageously ascertain the receive frequency depending on this natural frequency generated by a feedback process. The natural oscillation thus constitutes the response oscillation.

In a preferred embodiment, the frequency regulator is designed to ascertain the receive frequency depending on the response frequency in accordance with a predefined assignment rule. For example, a predefined assignment rule can be implemented by means of a stored look-up table, whereby one receive frequency is assigned in each case to a plurality of response frequencies.

By this means it is advantageously possible to take into consideration a frequency offset between a natural frequency generated by a feedback process and a receive frequency.

The embodiment described above is based on the knowledge that there is a relationship between natural frequency generated by a feedback process and a receive frequency of a resonant circuit, which for example can be represented by a predefined assignment rule. The frequency regulator can thus for example ascertain the receive frequency in accordance with a predefined assignment rule depending on the response frequency generated by a feedback process.

In another preferred embodiment of the receiver system, the excitation signal is a pulse signal limited in time or a step signal. This is based on the knowledge that a pulse signal as an approximation to a Dirac delta impulse can contain all the frequencies in the frequency slice from minus infinity to plus infinity and can thus excite a receiver, particularly an oscillating circuit of a receiver with all frequencies. In a preferred embodiment, the pulse signal exhibits a plurality of frequencies within a frequency slice. The pulse signal can for example be constituted by a signal with a predefined bandwidth.

In another embodiment, the excitation signal is constituted by a step signal, whereby the step signal exhibits an amplitude timing curve with a time-dependent amplitude rise. The frequency content of such a step signal is dependent on the rise of the amplitude curve.

An excitation signal can advantageously represent noise, particularly white noise. White noise contains all the frequencies of a frequency slice at the same energy level in each case. A frequency content of such an excitation signal can be registered for example by means of a Fourier transform.

In a preferred embodiment, the receiver system, particularly the oscillation receiver of the receiver system, is operatively connected to an oscillation sender for the transmission of information, whereby the oscillation sender is designed to generate the excitation signal.

In this embodiment, a sender of a transceiver can advantageously be used in order to generate the excitation signal.

In an advantageous embodiment, the oscillation receiver and the oscillation sender are each constituted at least partially by common parts. For example, a resonant circuit, particularly an inductance, particularly a coil, can be used both as a sending coil and also as a receiving coil.

In a preferred embodiment, the frequency regulator is designed to sample at least one period of the response oscillation and to register zero transitions within the period of the response oscillation and to ascertain the response frequency of the response oscillation depending on the registered zero transitions.

For example, the frequency regulator is designed to sample the at least one period of the response oscillation with at least twice the response frequency. By further preference, the frequency regulator is designed to sample the at least one period of the response oscillation with five times or ten times the response frequency.

A frequency regulator can thus register a response frequency in a simple manner. The frequency regulator can for example have a frequency divider which is designed to divide the number of registered zero transitions in accordance with a predefined division ratio.

In an advantageous embodiment, the frequency regulator is designed to add at least two periods of a response oscillation to one another or to duplicate a registered period of the response oscillation and add a duplication result formed in this way and the registered period of the response oscillation to one another.

The zero transitions contained in the addition result can then be registered.

In this manner, the frequency regulator can advantageously reduce statistical noise in a response signal.

This is particularly advantageous in a situation when the quality of a receiver system, particularly the quality of an oscillating circuit of a receiver system is low and on account of the low quality a decay over time of the response oscillation is brief.

The invention also relates to a method, particularly for an otological device, for receiving a carrier signal with a carrier signal frequency and regulating a receive frequency for receiving the carrier signal.

With regard to the method, the receive frequency is registered at least indirectly and the receive frequency, which is provided for receiving a carrier signal, is changed to a predetermined receive frequency. In addition, an excitation signal is generated and the excitation signal is used to excite an oscillation receiver to oscillate. In this manner, a response oscillation with a response frequency is generated. The receive frequency is ascertained depending on the response oscillation and is set to the predetermined receive frequency in a further step.

The excitation signal in the method described above can advantageously be generated by a feedback process of the oscillation receiver.

The excitation signal in the method described above can in another embodiment be a pulse signal limited in time or a step signal.

Further advantageous embodiments for a receiver system or for a method result from the features described in the dependent claims or from a combination of the features described in the dependent claims.

BRIEF DESCRIPTION OF THE DRAWINGS

The invention will now be described with reference to the figures and further embodiments.

FIG. 1 shows an embodiment of a receiver system for an otological device, which is designed to register a receive frequency by means of an excitation pulse;

FIG. 2 shows an embodiment of a receiver system for an otological device, which is designed to register a receive frequency by means of an excitation signal generated by a feedback process.

DETAILED DESCRIPTION OF THE INVENTION

FIG. 1 schematically illustrates an embodiment of a receiver system 1. The receiver system 1 has an oscillating circuit 3. The oscillating circuit 3 has an inductance 5 and a frequency setting element 7.

The frequency setting element 7 can for example be constituted by a voltage-dependent capacitance, particularly a variable capacitance diode.

The inductance 5 and the frequency setting element 7 are incorporated serially in each case into the oscillating circuit 3.

The receiver system 1 also has a regulator 9.

The regulator 9 is designed to receive a response frequency on the input side and to compare this with a predetermined frequency. The regulator 9 is designed, depending on a difference formed from the response frequency and the predetermined receive frequency, to generate a control signal for controlling the frequency setting element 7 and to output this on the output side.

The receiver system 1 also has an A/D converter 16 operatively connected to the oscillating circuit 3, said A/D converter being designed to sample a response signal received on the input side, representing for example a response oscillation, and to generate a sampled signal and to output this on the output side.

The receiver system 1 also has a zero transition counter 12 which is designed to ascertain zero transitions in a sampled signal received on the input side and to generate an output signal which represents the number of zero transitions ascertained, particularly the number of zero transitions ascertained within a time interval. The output signal from the zero transition counter 12 can thus represent a zero transition frequency.

The A/D converter 16 can for example be a 1-bit A/D converter.

The receiver system 1 also has a timer 14 which can for example have an oscillating crystal. The timer 14 is connected on the output side by way of a connecting line 38 to the zero transition counter 12 and can thus make available a time base for the zero transition counter 12. The timer 14 is also connected to the A/D converter 16 by way of a connecting line 40 and can thus constitute a time base for the A/D converter 16.

The receiver system 1 also has a memory 10 for a predetermined receive frequency. The regulator 9 is connected on the input side by way of a connecting line 36 to the memory 10 and is designed to read the predetermined receive frequency out of the memory 10. The regulator 9 is connected on the output side by way of a connecting line 46 to the frequency setting element 7. The regulator 9 can output the control signal provided for setting the frequency setting element 7 on the output side by way of the connecting line 46 and send it to the frequency setting element 7.

The oscillating circuit 3 is connected by way of a connection node 25 to an antenna 27. The antenna 27 can be a receiving antenna for a magnetic field or an electromagnetic field. In this embodiment, the antenna can receive a transmitted signal 60 and feed this by way of the connection node 25 into the oscillating circuit 3.

The transmitted signal 60 can represent information for an otological device, particularly a hearing aid or an accessory part, for example a remote control. Otherwise, the transmitted signal can for example represent data or a data record, whereby the data or the data record represents the information.

The receiver system 1 also has a pulse generator 18 which is designed to generate an excitation signal for generating a response oscillation, depending on a control signal received on the input side, and to output this on the output side. In this embodiment, the excitation signal is formed by a square pulse.

The pulse generator 18 is connected on the output side by way of a connecting line 48 to an excitation coil 22.

For this purpose, the excitation coil 22 can be located adjacent to the inductance 5 such that a magnetic field generated by the excitation coil 22 by means of an excitation signal sent to the excitation coil 22 can be received by the inductance 5 and can there induce a corresponding current. The excitation coil 22 and the inductance 5 can be coupled magnetically to one another.

The oscillating circuit 3 is connected by way of a connection node 23 and a connecting line 52 to a connection node 32. The A/D converter 16 is connected by way of a connecting line 53 to the connection node 32. The A/D converter 16 is thus operatively connected to the oscillating circuit 3. The connection node 32 is connected by way of a connecting line 50 to an output 30 for a demodulator. A demodulator of an otological device, particularly of a hearing aid, can for example be connected to the output 30. Other than the output 30 represented in this figure, an output for a demodulator, particularly a digital demodulator, can be connected to the output of the A/D converter.

The A/D converter 16 is connected on the output side by way of a connecting line 42 to the zero transition counter 12. The zero transition counter 12 is connected on the output side by way of a connecting line 44 to the regulator 9.

The mode of operation of the receiver system 1 will now be described in the following:

In order to ascertain a receive frequency of the oscillating circuit 3, the regulator 9 can generate a control signal intended for generating an excitation signal and send this control signal by way of connecting line 58 on the output side to the pulse generator 18.

The pulse generator 18 can generate an excitation signal depending on the control signal received on the input side and send this on the output side by way of the connecting line 48 to the excitation coil 22. The excitation coil 22 can generate a magnetic field corresponding to the excitation signal and couple this into the inductance 5 of the oscillating circuit 3 and generate a response oscillation there.

The energy thus fed in for the response oscillation can—by alternately generating inductive energy in the inductance 5 and capacitive energy in the frequency setting element 7 constituted by a voltage-dependent capacitance—be maintained in the oscillating circuit 3, depending on the quality of the oscillating circuit 3.

The response oscillation generated in this way will decay exponentially over the following course of time depending on the quality of the oscillating circuit 3.

A response signal corresponding to the response oscillation can be received by the A/D converter 16 on the input side by way of the connection node 23, the connecting line 52, the connection node 32 and the connecting line 53.

The A/D converter 16 can sample the response signal received on the input side and send a sampled response signal by way of the connecting line 42 to the zero transition counter 12. A time signal generated by the timer 14, which can serve as a time base, is available to the A/D converter 16 for sampling the response signal.

The zero transition counter 12 can, depending on the sampled response signal received on the input side, generate an output signal which represents a response frequency of the response oscillation.

In this embodiment, the response frequency registered by the zero transition counter 12 corresponds to twice the response frequency and thus to a receive frequency of the oscillating circuit 3, assuming a sinusoidal response signal.

The regulator 9 can now receive the signal representing the response frequency by way of the connecting line 44 on the input side and form a difference from a response frequency corresponding to this signal and a predetermined receive frequency read out from the memory 10.

In a further step, depending on the difference thus formed, the regulator 9 can generate a control signal in order to change a receive frequency and send this signal on the output side by way of the connecting line 46 to the frequency setting element 7. Depending on the control signal received on the input side, the frequency setting element 7 can change a receive frequency of the oscillating circuit 3 and set it to such a changed value.

The regulator 9 can repeat the method described above for example until such time as a difference formed from the response frequency and the predetermined frequency is sufficiently small or the response frequency and the predetermined frequency stored in the memory 10 are identical to one another.

In another embodiment, the receiver system 1 has no excitation coil 22. In this embodiment, the pulse generator 18 on the output side is connected by way of a connecting line 49 shown dashed to the connection node 23 and thus to the oscillating circuit 3. The pulse generator 18 can in this manner feed an excitation signal directly into the oscillating circuit 3.

In the case of an embodiment with the excitation coil 22, the oscillating circuit 3 is advantageously electrically isolated from the pulse generator 18.

Another embodiment is also conceivable in which the connecting line 52 can be connected to the excitation coil 22 by way of the connection node 23 instead of an electrical connection to the oscillating circuit 3. In this manner, a response oscillation originating from the inductance 5 can be coupled by way of a magnetic field into the excitation coil 22 and indirectly generate a response signal there. The response signal thus indirectly generated can be available to the A/D converter 16 on the input side by way of the connection node 32 and the connecting line 53.

FIG. 2 schematically illustrates another embodiment of a receiver system 2.

The receiver system 2 has an oscillating circuit 3. The oscillating circuit 3 has an inductance 5 and a frequency setting element 7.

The frequency setting element 7 can for example be constituted by a voltage-dependent capacitance, particularly a variable capacitance diode.

The inductance 5 and the frequency setting element 7 are incorporated serially in each case into the oscillating circuit 3.

The receiver system 2 also has a regulator 9.

The regulator 9 is designed to receive a response frequency on the input side and to compare this with a predetermined frequency. The regulator 9 is designed, depending on a difference formed from the response frequency and the predetermined receive frequency, to generate a control signal for controlling the frequency setting element 7 and to output this on the output side.

The receiver system 2 also has an A/D converter 16 operatively connected to the oscillating circuit 3, said A/D converter being designed to sample a response signal received on the input side, representing for example a response oscillation, and to generate a sampled signal and to output this on the output side.

The receiver system 2 also has a zero transition counter 12 which is designed to ascertain zero transitions in a sampled signal received on the input side and to generate an output signal which represents the number of zero transitions ascertained, particularly the number of zero transitions ascertained within a time interval. The output signal from the zero transition counter 12 can thus represent a zero transition frequency.

The A/D converter 16 can for example be a 1-bit A/D converter.

The receiver system 2 also has a timer 14 which can for example have an oscillating crystal. The timer 14 is connected on the output side by way of a connecting line 38 to the zero transition counter 12 and can thus make available a time base for the zero transition counter 12. The timer 14 is also connected to the A/D converter 16 by way of a connecting line 40 and can thus constitute a time base for the A/D converter 16.

The receiver system 2 also has a memory 10 for a predetermined receive frequency. The regulator 9 is connected on the input side by way of a connecting line 36 to the memory 10 and is designed to read the predetermined receive frequency out of the memory 10. The regulator 9 is connected on the output side by way of a connecting line 46 to the frequency setting element 7. The regulator 9 can output the control signal provided for setting the frequency setting element 7 on the output side by way of the connecting line 46 and send it to the frequency setting element 7.

The oscillating circuit 3 is connected by way of a connection node 25 to an antenna 27. The antenna 27 can receive a transmitted signal 60 and feed this by way of the connection node 25 into the oscillating circuit 3.

The oscillating circuit 3 of the receiver system 2 is connected by way of a connection node 21 and a connecting line 51 to a connection node 24. The connection node 24 is connected by way of a connecting line 56 to the connection node 32. The connection node 24 is also connected by way of a connecting line 55 to a feedback element 20.

The feedback element 20 can for example be constituted by an amplifier. The feedback element 20 is connected on the output side by way of a connecting line 54 to a switch 19, particularly an electronic switch for activating a response oscillation. The switch 19 is connected on the input side to the connecting line 54 and on the output side by way of a connecting line 52 and by way of a connection node 35 to the oscillating circuit 3. The switch 19, in order to actuate it, is connected by way of a connecting line 59 to the regulator 9.

The mode of operation of the receiver system 2 will now be described in the following:

The regulator 9 can for example, in order to register a receive frequency of the oscillating circuit 3, generate a control signal for generating a response oscillation and send this on the output side by way of the connecting line 19 to the switch 19 in order to actuate the latter. Depending on the control signal, the switch 19 can electrically connect the connecting line 54 and the connecting line 52 to one another. In this manner, the oscillating circuit 3 is fed back on itself by way of the connection node 21, by way of the connecting line 51, onward by way of the connection node 24 and the connecting line 55, onward by way of the feedback element 20, the connecting line 54, the closed switch 19, the connecting line 52 and finally by way of the connection node 35. As a result of this feedback loop formed in said manner, a response oscillation can be generated in the form of a feedback oscillation.

The response oscillation thus formed exhibits a natural frequency which is different from a receive frequency of the oscillating circuit 3. The response frequency of the response oscillation can be registered by way of the A/D converter 16, the connecting line 42, the zero transition counter 12, the connecting line 44—by analogy with the receiver system 1 described in FIG. 1—by the regulator 9 on the input side.

In a following step, the regulator can, depending on a difference formed from the response frequency and a predetermined receive frequency stored in the memory 10, generate a control signal for setting the frequency setting element 7 and sending this on the output side by way of the connecting line 46 to the frequency setting element 7.

A frequency offset, formed by a difference between the response frequency and twice a receive frequency of the oscillating circuit 3, can for example be taken into account by the regulator 9, or have already been taken into account by the fact that the predetermined frequency value stored in the memory 10 already represents such a frequency offset.

Alternatively, a response frequency can be halved and thus—for example in accordance with a predefined assignment rule, particularly in accordance with a look-up table—a frequency doubling caused by registration of the zero transitions can be taken into account.

The invention claimed is:

1. A receiver system for regulating a receive frequency of a carrier signal for an otological device, comprising:
    an oscillation receiver that receives the carrier signal;
    a frequency regulator at least indirectly connected to the oscillation receiver that:
        excites the oscillation receiver to oscillate by an excitation signal for generating a response oscillation with a response frequency,
        ascertains the receive frequency based on the response oscillation; and
    a memory connected to the frequency regulator that stores a predetermined receive frequency,
    wherein the frequency regulator is configured to:
        sample at least a period of the response oscillation with at least twice the response frequency,
        register a zero transition within the period of the response oscillation corresponding to twice the response frequency, and
        ascertain the response frequency based on the registered zero transition.

2. The receiver system as claimed in claim 1, wherein the frequency regulator at least indirectly:
    registers the receive frequency,
    reads out the predetermined receive frequency from the memory,
    changes the receive frequency to the predetermined receive frequency, and
    sets the receive frequency to the predetermined receive frequency.

3. The receiver system as claimed in claim 1, wherein the excitation signal is generated by the frequency regulator.

4. The receiver system as claimed in claim 1, wherein the excitation signal is a feedback signal generated in the oscillation receiver.

5. The receiver system as claimed in claim 1, wherein the excitation signal is selected from the group consisting of: a pulse signal limited in time, a step signal, and a noise signal.

6. The receiver system as claimed in claim 1, wherein the receive frequency is ascertained according to a predefined assignment rule implemented by a stored look-up table, whereby the receive frequency is assigned to the response frequency.

7. The receiver system as claimed in claim 1, wherein the oscillation receiver comprises an oscillating circuit comprising an inductance and a frequency setting element.

8. The receiver system as claimed in claim 7, wherein the oscillation receiver further comprises an excitation coil that is located adjacent to the inductance and receives the excitation signal.

9. The receiver system as claimed in claim 8, wherein the excitation coil generates a magnetic field according to the excitation signal and is coupled into the inductance and generates the response oscillation.

10. The receiver system as claimed in claim 1 wherein the otological device comprises an oscillation sender that is operatively connected to the oscillation receiver and generates the excitation signal.

11. The receiver system as claimed in claim 10, wherein the oscillation receiver and the oscillation sender comprise a common part.

12. The receiver system as claimed in claim 1, wherein the otological device is a hearing aid.

13. A method for regulating a receive frequency of a carrier signal for an otological device, comprising:

generating an excitation signal by an frequency regulator;
exciting an oscillation receiver to oscillate by the excitation signal for generating a response oscillation with a response frequency;
sampling at least a period of the response oscillation with at least twice the response frequency;
registering a zero transition within the period of the response oscillation corresponding to twice the response frequency; and
ascertaining the response frequency based on the registered zero transition;
ascertaining the receive frequency based on the response oscillation; and
storing a predetermined receive frequency in a memory connected to the frequency regulator.

14. The method as claimed in claim 13, further comprising reading out the predetermined receive frequency from the memory, and wherein the receive frequency is:
at least indirectly registered,
changed to the predetermined receive frequency, and
set to the predetermined receive frequency.

15. The method as claimed in claim 13, wherein the excitation signal is a feedback signal generated in the oscillation receiver.

16. The method as claimed in claim 13, wherein the excitation signal is selected from the group consisting of: a pulse signal limited in time, a step signal, and a noise signal.

17. The method as claimed in claim 13, wherein the receive frequency is ascertained according to a predefined assignment rule implemented by a stored look-up table, whereby the receive frequency is assigned to the response frequency.

18. The method as claimed in claim 13, wherein the otological device is a hearing aid.

* * * * *